US011349327B2

(12) United States Patent
Lee et al.

(10) Patent No.: US 11,349,327 B2
(45) Date of Patent: May 31, 2022

(54) APPARATUS AND CONTROL METHOD FOR BATTERY MANAGEMENT SYSTEM

(71) Applicant: SK INNOVATION CO., LTD., Seoul (KR)

(72) Inventors: Yong Hee Lee, Daejeon (KR); Jae Yun Min, Daejeon (KR); Ju Young Choi, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 201 days.

(21) Appl. No.: 15/931,822

(22) Filed: May 14, 2020

(65) Prior Publication Data
US 2020/0366118 A1 Nov. 19, 2020

(30) Foreign Application Priority Data

May 15, 2019 (KR) ........................ 10-2019-0056742

(51) Int. Cl.

| | |
|---|---|
| *H02J 7/00* | (2006.01) |
| *H01M 10/42* | (2006.01) |
| *H01M 10/44* | (2006.01) |
| *G01R 31/367* | (2019.01) |
| *B60L 58/22* | (2019.01) |
| *G01R 31/3842* | (2019.01) |
| *G01R 31/392* | (2019.01) |
| *G01R 31/36* | (2020.01) |
| *B60L 58/16* | (2019.01) |
| *B60L 58/24* | (2019.01) |
| *G01R 31/389* | (2019.01) |

(52) U.S. Cl.
CPC ..... *H02J 7/007194* (2020.01); *H01M 10/425* (2013.01); *H01M 10/443* (2013.01); *H02J 7/00309* (2020.01); *H02J 7/007182* (2020.01); *B60L 58/16* (2019.02); *B60L 58/22* (2019.02); *B60L 58/24* (2019.02); *G01R 31/367* (2019.01); *G01R 31/3648* (2013.01); *G01R 31/389* (2019.01); *G01R 31/3842* (2019.01); *G01R 31/392* (2019.01); *H01M 2010/4271* (2013.01); *H02J 7/00* (2013.01); *H02J 7/0048* (2020.01)

(58) Field of Classification Search
CPC ............ H02J 7/007194; H02J 7/00309; H02J 7/007182; H01M 10/425; H01M 10/443; H01M 10/4271
See application file for complete search history.

(56) References Cited

U.S. PATENT DOCUMENTS

| | | | |
|---|---|---|---|
| 9,142,977 B1 * | 9/2015 | Chang | ................. H02J 7/0071 |
| 9,906,069 B2 * | 2/2018 | Semanson | ............ G01R 31/382 |

(Continued)

FOREIGN PATENT DOCUMENTS

| | | | | |
|---|---|---|---|---|
| CN | 101312298 A | * | 11/2008 | ............ H02J 7/0069 |
| CN | 102395895 A | * | 3/2012 | ........... G01R 31/396 |

(Continued)

*Primary Examiner* — David V Henze-Gongola
*Assistant Examiner* — Tarikh Kanem Rankine
(74) *Attorney, Agent, or Firm* — IP & T Group LLP

(57) ABSTRACT

An embodiment of the present invention is directed to providing an apparatus and a control method for a battery management system (BMS) that may operate in an optimal charging temperature range to suppress deterioration of battery cells during rapid charging of a secondary battery that requires a high charging current.

10 Claims, 7 Drawing Sheets

(56) References Cited

U.S. PATENT DOCUMENTS

| | | | | |
|---|---|---|---|---|
| 10,601,085 B2* | 3/2020 | Lim | | H01M 10/486 |
| 2001/0022518 A1* | 9/2001 | Asakura | | H02M 3/07 |
| | | | | 324/426 |
| 2001/0051300 A1* | 12/2001 | Moriguchi | | C01B 32/205 |
| | | | | 429/231.8 |
| 2003/0054229 A1* | 3/2003 | Odaohhara | | H01M 10/48 |
| | | | | 429/61 |
| 2003/0117112 A1* | 6/2003 | Chen | | H02J 7/0071 |
| | | | | 320/137 |
| 2004/0222769 A1* | 11/2004 | Al-Anbuky | | H02J 7/0072 |
| | | | | 320/128 |
| 2005/0052155 A1* | 3/2005 | Surig | | H02J 7/0021 |
| | | | | 320/116 |
| 2005/0257546 A1* | 11/2005 | Ishishita | | H05K 7/20209 |
| | | | | 62/236 |
| 2006/0273761 A1* | 12/2006 | Arai | | G01R 31/392 |
| | | | | 320/132 |
| 2007/0001649 A1* | 1/2007 | Cho | | G01R 31/374 |
| | | | | 320/132 |
| 2007/0096743 A1* | 5/2007 | Arai | | G01R 31/392 |
| | | | | 324/426 |
| 2008/0036421 A1* | 2/2008 | Seo | | B60L 58/15 |
| | | | | 320/132 |
| 2008/0122400 A1* | 5/2008 | Kubota | | H02J 7/00047 |
| | | | | 320/106 |
| 2008/0169819 A1* | 7/2008 | Ishii | | G01R 31/389 |
| | | | | 324/430 |
| 2009/0295334 A1* | 12/2009 | Yang | | H02J 7/007194 |
| | | | | 320/134 |
| 2010/0259223 A1* | 10/2010 | Gale | | G01K 7/16 |
| | | | | 320/137 |
| 2010/0259242 A1* | 10/2010 | Gale | | B60L 3/04 |
| | | | | 323/318 |
| 2014/0132214 A1* | 5/2014 | Katanoda | | B60L 58/15 |
| | | | | 320/109 |
| 2015/0241516 A1* | 8/2015 | Hotta | | G01R 31/3835 |
| | | | | 429/90 |
| 2016/0329612 A1* | 11/2016 | Jung | | H02J 7/00 |
| 2016/0380313 A1* | 12/2016 | Morita | | H02J 7/00712 |
| | | | | 429/50 |
| 2017/0126027 A1* | 5/2017 | Park | | G01R 31/382 |
| 2017/0194669 A1* | 7/2017 | Christensen | | G01R 31/367 |
| 2017/0225576 A1* | 8/2017 | Gale | | B60L 3/04 |
| 2019/0064282 A1 | 2/2019 | Haga et al. | | |
| 2020/0278399 A1* | 9/2020 | Zhang | | B60L 58/12 |
| 2021/0148985 A1* | 5/2021 | Yoon | | G01K 7/02 |

FOREIGN PATENT DOCUMENTS

| | | | | |
|---|---|---|---|---|
| CN | 105633495 A | * | 6/2016 | ........ H02J 7/007194 |
| CN | 106208241 A | * | 12/2016 | |
| CN | 108666600 A | * | 10/2018 | |
| CN | 109839601 A | * | 6/2019 | ............ B60L 58/16 |
| CN | 111953032 A | * | 11/2020 | ........ H02J 7/007192 |
| EP | 3252918 A1 | | 12/2017 | |
| EP | 3739719 A1 | * | 11/2020 | .......... H02J 7/00309 |
| EP | 3889626 A1 | * | 10/2021 | .......... G01R 31/392 |
| JP | 2004003460 A | * | 1/2004 | |
| JP | 2005295644 A | * | 10/2005 | |
| JP | 2011018532 A | * | 1/2011 | ........ G01R 31/3842 |
| KR | 10-1249347 | | 4/2013 | |
| KR | 10-1609076 | | 4/2016 | |
| KR | 10-2019-0006550 | | 1/2019 | |
| KR | 19-2019-0000445 | | 1/2019 | |
| WO | WO-2020108638 A1 | * | 6/2020 | ............ H02J 7/0047 |

* cited by examiner (a)

(b)

APPARATUS AND CONTROL METHOD FOR BATTERY MANAGEMENT SYSTEM

CROSS-REFERENCE TO RELATED APPLICATIONS

This application claims priority under 35 U.S.C. § 119 to Korean Patent Application No. 10-2019-0056742, filed on May 15, 2019, in the Korean Intellectual Property Office, the disclosure of which is incorporated herein by reference in its entirety.

TECHNICAL FIELD

The following disclosure relates to an apparatus and a control method for a battery management system (BMS).

BACKGROUND

As the demand for electric vehicles rapidly increases, consumers' demands for improving the ease of use of electric vehicles are increasing. In particular, rapid charging technology is being actively developed to shorten a charging time of secondary batteries in the electric vehicles. However, in the case of an electric vehicle requiring a high energy density, a high current is applied during rapid charging, and heat generated at this time may have a great influence on the deterioration of battery cells.

In order to prevent the deterioration of the battery cells due to a heat generation phenomenon during the rapid charging of the secondary battery, the existing rapid charging technology simply measures a temperature of the secondary battery and compares the measured temperature with a reference value to control a charging current of the secondary battery. However, a change in the temperature of the secondary battery is accompanied by a time delay, and even if the charging current of the secondary battery is lowered when the temperature of the secondary battery exceeds the reference value, the temperature of the secondary battery reaches the temperature that affects the battery cells and affects the deterioration of the battery cells. In addition, in order to prevent such a problem, when the charging current of the secondary battery is controlled by lowering a temperature reference value, there is a problem that a charging speed of the secondary battery may not be shortened.

A secondary battery protection apparatus that also considers a linear change in the temperature of the secondary battery is disclosed in Korean Patent Publication No. 10-1249347 entitled "Secondary Battery having Temperature Measuring Pad and Protection Apparatus for the Same" (Patent Document 1). Patent Document 1 discloses a secondary battery and a protection apparatus for the same that blocks a flow of current when a rate of change of a temperature measurement value based on a previous time point and a current time point is a threshold value or more. This has the effect of preventing an occurrence of safety accidents such as fire or explosion by the secondary battery by blocking the flow of current based on the rate of change of the temperature measurement value when abnormality of the secondary battery such as over-current occurs, but in Patent Document, since the current is blocked by only controlling a switch when the rate of change of the temperature measurement value is the threshold value or more, rapid charging that shortens the charging speed of the secondary battery is not possible.

RELATED ART DOCUMENT

Patent Document (Patent Document 1) Korean Patent Publication No. 10-1249347 ("Secondary Battery having Temperature Measuring Pad and Protection Apparatus for the Same", published on Apr. 1, 2013)

SUMMARY

An embodiment of the present invention is directed to providing an apparatus and a control method for an apparatus for a battery management system (BMS) that may operate in an optimal charging temperature range to suppress deterioration of battery cells during rapid charging of a secondary battery that requires a high charging current.

Further, an embodiment of the present invention is directed to providing an apparatus and a control method for an apparatus for a battery management system (BMS) that may improve life stability of battery cells and modules by minimizing deterioration of the battery cells due to exposure to a high temperature.

In one general aspect, an apparatus for a battery management system (BMS) includes: a measuring unit measuring or estimating a temperature, a state of charge (SOC), a voltage, and a charging current of a battery; a first calculating unit calculating a temperature change amount for each charge amount of the temperature of the battery with respect to the SOC or the voltage of the battery, based on the temperature, the SOC, and the voltage of the battery measured at different time points by the measuring unit; a second calculating unit calculating an expected temperature of the battery when the SOC of the battery is charged with a first reference value, based on the temperature, the SOC, and the temperature change amount for each charge amount of the battery; and a control unit controlling a first charging current based on information obtained by comparing the expected temperature calculated by the second calculating unit and a predetermined first reference temperature, and charging the battery with the first charging current.

The control unit may increase the first charging current when the expected temperature is the first reference temperature or less, and decrease the first charging current when the expected temperature is the first reference temperature or more.

The first calculating unit may calculate the temperature change amount for each charge amount based on a first SOC, a second SOC, a first temperature, and a second temperature, the first SOC may be the SOC of the battery measured at a first time point, and the second SOC may be the SOC of the battery measured at a second time point different from the first time point, and the first temperature may be the temperature of the battery measured at the first time point, and the second temperature may be the temperature of the battery measured at the second time point.

The control unit may charge the battery with a second charging current that is the first charging current or less as the charging current of the battery, when the temperature of the battery measured by the measuring unit exceeds the first reference temperature.

The control unit may charge the battery with a third charging current different from the first charging current as the charging current of the battery, when the SOC of the battery measured by the measuring unit exceeds the first reference value.

In another general aspect, a control method for an apparatus for a battery management system (BMS) includes: a measuring step of measuring or estimating a temperature, a state of charge (SOC), a voltage, and a charging current of a battery; a first calculating step of calculating a temperature change amount for each charge amount of the temperature of the battery with respect to the SOC or the voltage of the battery, based on the temperature, the SOC, and the voltage of the battery measured at different time points in the measuring step; a second calculating step of calculating an expected temperature of the battery when the SOC of the battery is charged with a first reference value, based on the temperature, the SOC, and the temperature change amount for each charge amount of the battery; and a controlling step of controlling a first charging current based on information obtained by comparing the expected temperature calculated in the second calculating step and a predetermined first reference temperature, and charging the battery with the first charging current.

In the controlling step, the first charging current may be increased when the expected temperature is the first reference temperature or less, and the first charging current may be decreased when the expected temperature is the first reference temperature or more.

In the first calculating step, the temperature change amount for each charge amount may be calculated based on a first SOC, a second SOC, a first temperature, and a second temperature, the first SOC may be the SOC of the battery measured at a first time point, and the second SOC may be the SOC of the battery measured at a second time point different from the first time point, and the first temperature may be the temperature of the battery measured at the first time point, and the second temperature may be the temperature of the battery measured at the second time point.

In the controlling step, the battery may be charged with a second charging current that is the first charging current or less as the charging current of the battery, when the temperature of the battery measured in the measuring step exceeds the first reference temperature.

In the controlling step, the battery may be charged with a third charging current different from the first charging current as the charging current of the battery, when the SOC of the battery measured in the measuring step exceeds the first reference value.

DETAILED DESCRIPTION OF EMBODIMENTS

Hereinafter, an apparatus and a control method for a battery management system (BMS) according to the present invention will be described in detail with reference to the accompanying drawings.

Figure 1:
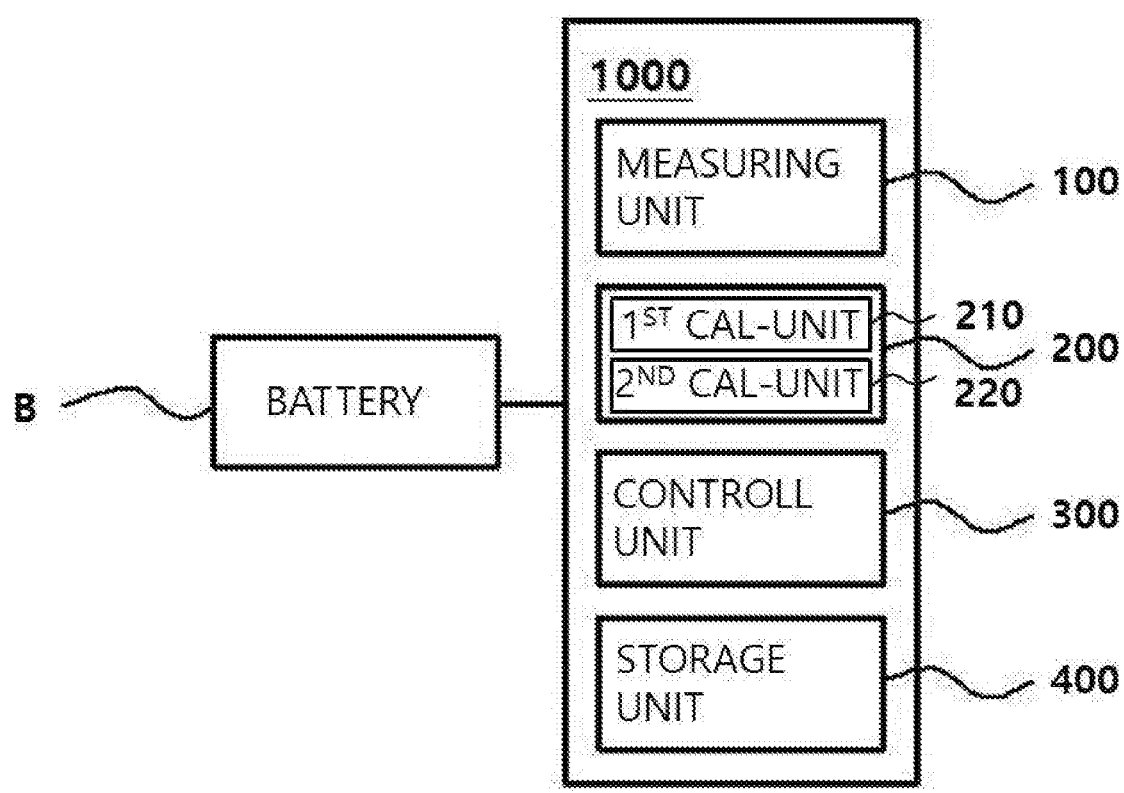
FIG. 1 is a block diagram illustrating an apparatus for a battery management system (BMS) according to the present invention.

As illustrated in FIG. 1, an apparatus 1000 for a battery management system (BMS) according to the present invention may include a measuring unit 100, a calculating unit 200, and a control unit 300. In addition, the calculating unit 200 may include a first calculating unit 210 and a second calculating unit 220.

The respective components will be described in detail. The measuring unit 100 may measure or estimate a temperature T, a state of charge (SOC) C, a voltage V, and a charging current I of a battery B.

The temperature T, the voltage V, and the charging current I of the battery B may be measured using well-known measuring instruments or methods, and the SOC C of the battery B is generally impossible to directly measure, and may thus be estimated by an indirect method. As an example, in order to estimate the SOC C of the battery B, information on the measured temperature T, voltage V, and/or charging current I of the battery B may be used, but the estimation method of the SOC C of the battery B is not limited thereto, and the SOC C of the battery B may be estimated by various conventionally known methods.

The first calculating unit 210 may calculate a temperature change amount $\Delta T/\Delta C$ for each charge amount of the temperature T of the battery B with respect to the SOC C or the voltage V of the battery, based on information on the temperature T, SOC C and voltage V of a plurality of batteries measured at different time points t in the measuring unit 100.

The second calculating unit 220 may calculate an expected temperature T_exp of the battery B expected when the SOC C of the battery is charged with a first reference value C_th1, based on information on the temperature T, SOC C, and temperature change amount $\Delta T/\Delta C$ for each charge amount of the battery B.

The calculating unit 200 will be described in more detail. The first calculating unit 210 may calculate the temperature change amount $\Delta T/\Delta C$ for each charge amount based on information on a first SOC C1, a second SOC C2, a first temperature T1, and a second temperature T2 as illustrated in Table 1 below. Table 1 below illustrates the SOC C and temperature T of the battery measured at different time points t.

TABLE 1

| Time Point (t) | SOC (C) | Temperature (T) |
|---|---|---|
| t1 | C1 | T1 |
| t2 | C2 | T2 |
| t3 | C3 | T3 |
| ... | ... | ... |
| t(k − 2) | C(k − 2) | T(k − 2) |
| t(k − 1) | C(k − 1) | T(k − 1) |
| t(k) | C(k) | T(k) |
| ... | ... | ... |

Since the temperature T of the battery B changes in relation to the SOC C of the battery, it may be expressed as Equation 1 below.

$$T=f(C)=r_iC^i+r_{i-1}C^{i-1}+\cdots+r_1C+r_0 \quad \text{[Equation 1]}$$

In addition, Equation 1 above may be approximated as Equation 2 below.

$$T=f(C)\approx r_1C+r_0 \quad \text{[Equation 2]}$$

Figure 2:
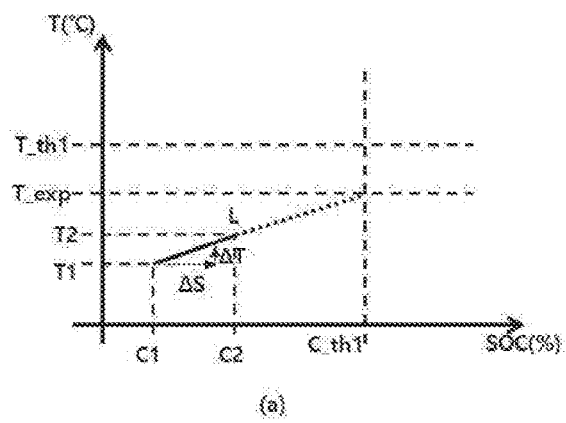
FIGS. 2 and 3 illustrate examples of a temperature graph of a battery according to a state of charge (SOC) of the battery of the apparatus for a BMS according to the present invention.
Figure 2:
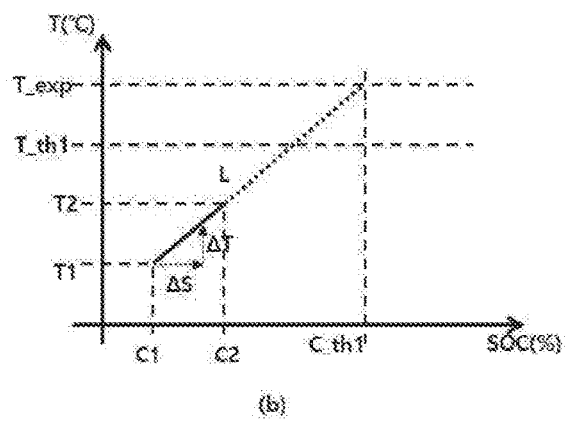

Equation 2 above is a function of a trend line L of FIG. 2 and $r_1$ of Equation 2 is the temperature change amount $\Delta T/\Delta C$ for each charge amount, and therefore, if the first SOC C1, the second SOC C2, the first temperature T1, and the second temperature T2 are substituted into Equation 2, $r_1$, that is, the temperature change amount $\Delta T/\Delta C$ for each charge amount, may be calculated as (T2−T1)/(C2−C1). Since $r_0$ is also similarly known, the second calculating unit 220 may calculate the expected temperature T_exp expected by substituting the first reference value C_th1 into C of Equation 2 in which $r_0$ and $r_1$ are calculated.

In addition, Equation 1 above may be approximated as Equation 3 below.

$$T = f(C) \approx r_2 C^2 + r_1 C + r_0 \qquad \text{[Equation 3]}$$

Figure 3:
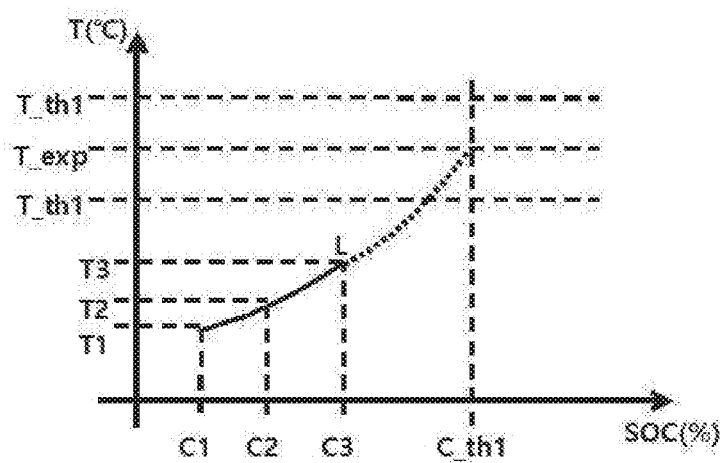

As illustrated in Table 1 and FIG. 3, when a current time point is t3, the first calculating unit 210 calculates $r_0$, $r_1$, and $r_2$ of Equation 3 using information on the temperature T and the SOC C of the battery B at previous time points t1 and t2 such that the second calculating unit 220 may calculate the expected temperature T_exp expected by substituting the first reference value C_th1 into C of Equation 3 in which $r_0$, $r_1$, and $r_2$ are calculated.

Similarly, when a current time point is t(k), the first calculating unit 210 calculates $r_0$, $r_1$, and $r_2$ of Equation 3 using information on the temperature T and the SOC C of the battery B at previous time points t(k−2) and t(k−1) such that the second calculating unit 220 may calculate the expected temperature T_exp expected by substituting the first reference value C_th1 into C of Equation 3 in which $r_0$, $r_1$, and $r_2$ are calculated.

At this time, if a trend equation of the temperature T of the battery according to the SOC C of the battery B is approximated as Equation 3, a more accurate expected temperature T_exp than the approximation as Equation 2 may be calculated and the control unit 300 may also calculate the charging current I more accurately, which has the effect of rapid charging.

The apparatus 1000 for a BMS according to the present invention may approximate Equation 1 using the temperature T of the battery according to the SOC C of the battery B at the current time point and one or two previous time points as illustrated in Equations 2 and 3 above, and may also approximate Equation 1 using the SOC C and the temperature T of the battery B at two or more previous time points.

On the other hand, the control unit 300 may control a first charging current I_c1 based on information obtained by comparing the expected temperature T_exp calculated by the second calculating unit 220 and the first reference temperature T_th1 determined by the user, and charge the battery with the first charging current I_c1.

In detail, the control unit 300 may control the first charging current I_c1 by increasing the first charging current I_c1 when the expected temperature T_exp of the trend line L is the first reference temperature T_th1 or less as illustrated in FIG. 2A or 3, and decreasing the first charging current I_c1 when the expected temperature T_exp of the trend line L is the first reference temperature T_th1 or more as illustrated in FIG. 2B or 3.

On the other hand, as illustrated in FIG. 1, the apparatus 1000 for a BMS may further include a storage unit 400. The storage unit 400 may learn the stored history of data that has been charged in the past.

The storage unit 400 will be described in more detail. When the first charging current I_c1 is controlled by comparing the expected temperature T_exp calculated by the second calculating unit 200 and the first reference temperature T_th1, the storage unit 400 may store and learn data of an optimal charging current I_opt that the expected temperature T_exp according to the SOC C, the temperature T, and the temperature change amount $\Delta T/\Delta C$ for each charge amount of the battery B is equal to the first reference temperature T_th1 as illustrated in Table 2 below. Therefore, when the expected temperature T_exp is different from the first reference temperature T_th1, the optimal charging current I_opt that the expected temperature T_exp is equal to the first reference temperature T_th1 may be immediately calculated without gradually increasing or decreasing the first charging current I_c1.

TABLE 2

| SOC (C) | Temperature (T) | $\Delta T/\Delta C$ | Expected Temperature (T_exp) | I_opt |
|---|---|---|---|---|
| . . . | . . . | . . . | . . . | . . . |
| C(k) | T(k) | $\Delta T/\Delta C$(k) | T_exp(k) | I_opt(k) |
| C(k + 1) | T(k + 1) | $\Delta T/\Delta C$(k + 1) | T_exp(k + 1) | I_opt(k + 1) |
| C(k + 2) | T(k + 2) | $\Delta T/\Delta C$(k + 2) | T_exp(k + 2) | I_opt(k + 2) |
| . . . | . . . | . . . | . . . | . . . |

Further, if the storage unit 400 stores and learns the data of the optimal charging current I_opt that the expected temperature T_exp according to the SOC C, the temperature T, and the temperature change amount $\Delta T/\Delta C$ for each charge amount of the battery B is equal to the first reference temperature T_th1 as illustrated in Table 2 above, the storage unit 400 may calculate the optimal charging current I_opt using the SOC C and the temperature T of the battery B at the current time point, a predetermined first reference temperature T_th1, and a first reference value C_th1. Here, the predetermined first reference temperature T_th1 and the first reference value C_th1 may be determined by the user.

In more detail, the temperature change amount $\Delta T/\Delta C$ for each charge amount may be calculated as Equation 4 below using the SOC C and the temperature T of the battery B measured at the current time point, the first reference temperature T_th1, and the first reference value C_th1.

$$\frac{\Delta T}{\Delta C} = \frac{T_{th1} - T_{current}}{C_{th1} - C_{current}} \qquad \text{[Equation 4]}$$

The optimal charging current I_opt may be calculated as illustrated in Equation 5 below using the optimal charging current I_opt according to the SOC C, the temperature T, and the temperature change amount $\Delta T/\Delta C$ for each charge amount of the battery B as illustrated in Table 2 above.

$$I_{opt} = g\left(T_{current}, C_{current}, \frac{\Delta T}{\Delta C}\right) \qquad \text{[Equation 5]}$$

Therefore, even if characteristics of the optimal charging current (I_opt) according to the SOC C, the temperature T, and the temperature change amount $\Delta T/\Delta C$ for each charge amount are unknown depending on each battery B cell, the apparatus 1000 for a BMS according to the present invention has an effect of suppressing deterioration of the battery cell while rapidly charging a secondary battery by calculating the optimal charging current I_opt by grasping the characteristics of the battery B cell.

In addition, when the temperature T of the battery B measured by the measuring unit 100 exceeds the first reference temperature T_th1, the control unit 300 may charge the battery B with a second charging current I_c2 that is the first charging current I_c1 or less, as the charging current I of the battery B. That is, the second charging current I_c2 may be a value that is less than the first charging current I_c1. At this time, the second charging current I_c2 may be 50 to 99% of the first charging current I_c1.

In addition, when the SOC C of the battery B measured by the measuring unit 100 exceeds the first reference value C_th1, the control unit 300 may charge the battery B with a third charging current I_c3 that is different from the first charging current I_c1, as the charging current I of the battery B. That is, the third charging current I_c3 may be a value that is less than the first charging current I_c1. At this time, the third charging current I_c3 may be 50 to 99%, of the first charging current I_c1.

As described above, the first calculating unit 210 approximates Equation of the temperature T of the battery B according to the SOC C of the battery B by calculating the temperature change amount ΔT/ΔC for each charge amount of the battery B, the second calculating unit 220 calculates the expected temperature T_exp of the battery B expected when the SOC C of the battery B is charged with the first reference value C_th1 using the approximated Equation, and the control unit 300 calculates the first charging current I_c1 and charges the battery B by decreasing or changing the charging current I of the battery B when the temperature T or the SOC C of the battery B exceeds the first reference temperature T_th1 or the first reference value C_th1.

On the other hand, the apparatus 1000 for a BMS according to the present invention may charge the battery B by setting a plurality of reference temperatures of the battery B and a plurality of reference values of the SOC C of the battery B to calculate the charging current I of the battery B.

Figure 4:
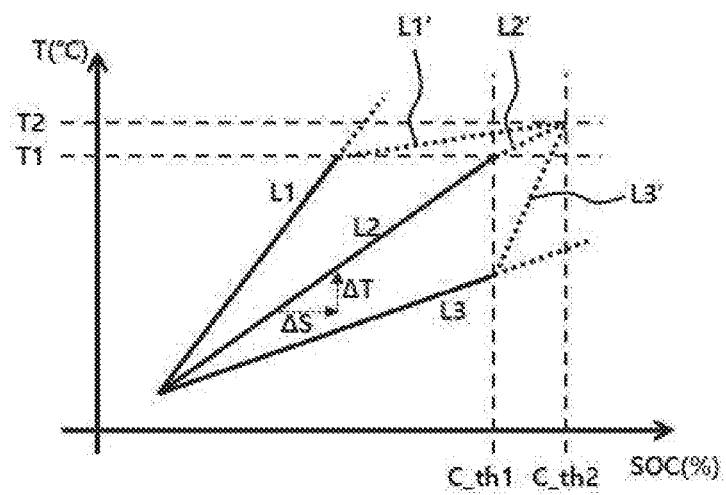
FIG. 4 illustrates another example of the temperature graph of the battery according to the SOC of the battery of the apparatus for a BMS according to the present invention.

For example, as illustrated in FIG. 4, when the temperature T of the battery B exceeds the first reference temperature T_th1 or the SOC C of the battery B exceeds the first reference value C_th1, the control unit 300 does not change the charging current I of the battery B to the second charging current I_c2 or the third charging current I_c3, the first calculating unit 210 calculates trend equations of trend lines L1', L2', and L3' of the temperature T of the battery B according to the SOC C of the battery B as illustrated in Equation 2 or 3 by calculating the temperature change amount ΔT/ΔC for each charge amount of the battery B again, the second calculating unit 220 calculates the expected temperature T_exp of the battery B expected when the SOC C of the battery B is charged with the second reference value C_th2 using the calculated trend equations, and the control unit 300 may charge the battery B such as L3' by increasing the charging current I when the expected temperature T_exp is the second reference temperature T_th2 or less such as an extension line of L3, and charge the battery B such as L1' by decreasing the charging current I when the expected temperature T_exp is the second reference temperature T_th2 or more such as an extension line of L1.

As such, by setting the plurality of reference temperatures, it is possible to more reliably prevent the temperature of the battery B cell from reaching the temperature at which the deterioration of the cell occurs, and by setting the plurality of reference values of the SOC C of the battery B, the SOC C of the battery B may reach a specific reference value more quickly, thereby allowing rapid charging.

Hereinafter, a control method for an apparatus 1000 for a BMS will be described in detail.

Figure 5:
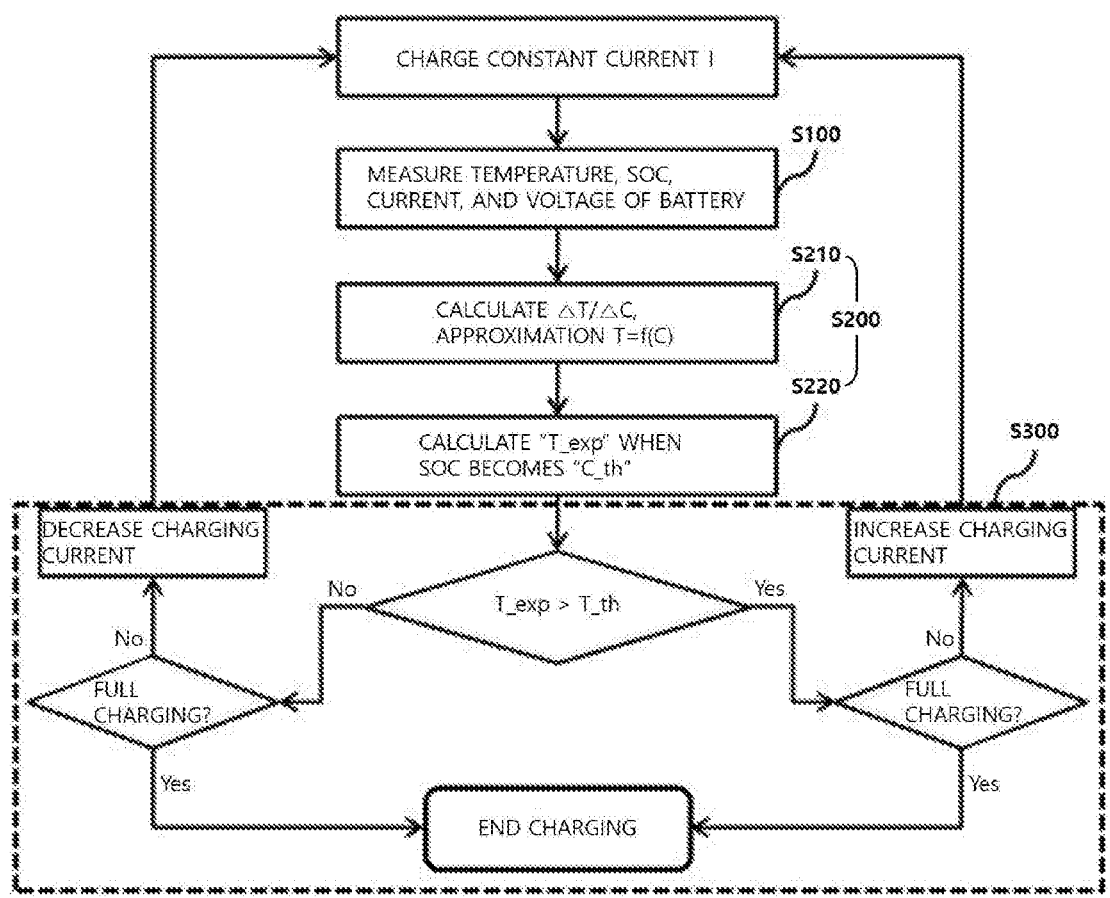
FIGS. 5 to 7 are flowcharts of the control method for an apparatus for a BMS according to the present invention.

As illustrated in FIG. 5, a control method for an apparatus 1000 for a BMS according to the present invention may include a measuring step S100, a calculating step S200, and a controlling step S300. In addition, the calculating step S200 may include a first calculating step S210 and a second calculating step S220. The respective steps will be described in detail. In the measuring step S100, a temperature T, a state of charge (SOC) C, a voltage V, and a charging current I of a battery B may be measured or estimated. In addition, in the first calculating step S210, a temperature change amount ΔT/ΔC for each charge amount of the temperature T of the battery B that rises to increase a unit level ΔC of the SOC C may be calculated based on information on the temperature T, SOC C and voltage V of a plurality of batteries measured at different time points t in the measuring step S100, and Equation of the temperature T of the battery B according to the SOC C of the battery B may be approximated. The detailed description has been made in the apparatus 1000 for a BMS, and is thus omitted.

In the second calculating step S220, an expected temperature T_exp of the battery B expected when the SOC C of the battery is charged with a first reference value C_th1 may be calculated based on information on the temperature T, SOC C, and temperature change amount ΔT/ΔC for each charge amount of the battery B, and information on the approximated Equation of the temperature T of the battery B according to the SOC C of the battery B. At this time, in the controlling step S300, a first charging current I_c1 may be calculated by increasing the first charging current I_c1 when the expected temperature T_exp calculated in the second calculating step S220 is a predetermined first reference temperature T_th1 or less, and decreasing the first charging current I_c1 when the expected temperature T_exp is the first reference temperature T_th1 or more.

On the other hand, as illustrated in FIG. 5, the control method for an apparatus 1000 for a BMS for a BMS may further include a storing step S400. In the storing step S400, a stored history of data that has been charged in the past may be learned.

The storing step S400 will be described in more detail. When the first charging current I_c1 is controlled by comparing the expected temperature T_exp calculated in the second calculating step S200 and the first reference temperature T_th1, in the storing step S400, data of an optimal charging current I_opt that the SOC C, the temperature T, and the expected temperature T_exp of the battery B are equal to the first reference temperature T_th1 may be stored and learned by learning an increase or decrease in the first charging current I_c1 as illustrated in FIG. 5. Therefore, when the expected temperature T_exp is different from the first reference temperature T_th1, the optimal charging current I_opt that the expected temperature T_exp is equal to the first reference temperature T_th1 may be immediately calculated without gradually increasing or decreasing the first charging current I_c1.

Figure 6:
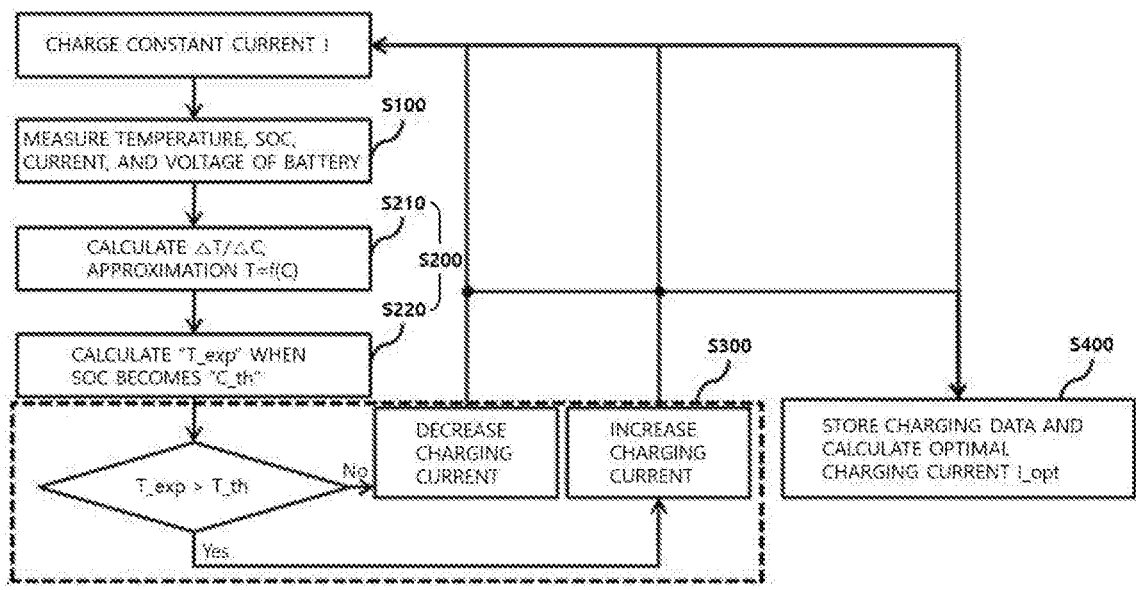
Figure 7:
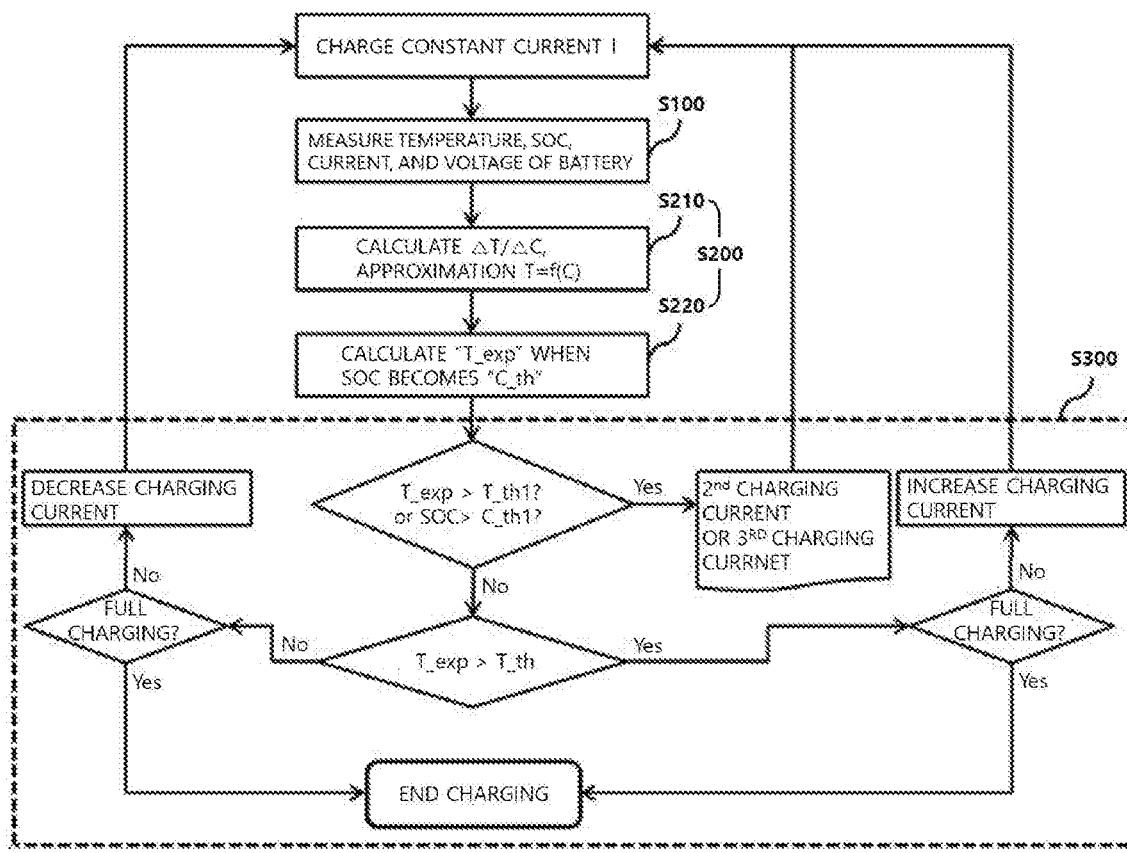

As illustrated in FIG. 6, in the controlling step S300, when the temperature T of the battery B measured in the measuring step S100 exceeds the first reference temperature T_th1 or the SOC C of the battery B exceeds the first reference value C_th1, the battery B may be charged with a second charging current I_c2 that is the first charging current I_c1 or less or a third charging current I_c3 that is different from the first charging current I_c1, as the charging current I of the battery B.

According to the apparatus and the control method for a BMS according to various embodiments of the present invention as described above, a relational expression of the battery temperature according to the SOC of the battery is approximated, a charging current of the battery reaching the SOC of the battery and the temperature of the battery that are desired by the user is calculated based on the relational expression, and the battery is charged with the charging current, thereby making it possible to suppress the deterioration of the battery cells while rapidly charging the secondary battery.

The present invention is not limited to the above-mentioned embodiments, and may be variously applied, and may be variously modified without departing from the gist of the present invention claimed in the claims.

DETAILED DESCRIPTION OF MAIN ELEMENTS

100: measuring unit
200: calculating unit
210: first calculating unit
220: second calculating unit
300: control unit
C_th: reference value
T_exp: expected temperature
T_th: reference temperature
S100: measuring step
S200: calculating step
S210: first calculating step
S220: second calculating step
S300: controlling step
S400: storing step

What is claimed is:

1. An apparatus for a battery management system (BMS) comprising:
a measuring unit measuring or estimating a temperature, a state of charge (SOC), a voltage, and a charging current of a battery;
a first calculating unit calculating a temperature change amount for each charge amount of the temperature of the battery with respect to the SOC or the voltage of the battery, based on the temperature, the SOC, and the voltage of the battery measured at different time points by the measuring unit;
a second calculating unit calculating an expected temperature of the battery when the SOC of the battery is charged with a first reference value, based on the temperature, the SOC, and the temperature change amount for each charge amount of the battery; and
a control unit controlling a first charging current based on information obtained by comparing the expected temperature calculated by the second calculating unit and a predetermined first reference temperature, and charging the battery with the first charging current.

2. The apparatus for a BMS of claim 1, wherein the control unit increases the first charging current when the expected temperature is the first reference temperature or less, and decreases the first charging current when the expected temperature is the first reference temperature or more.

3. The apparatus for a BMS of claim 2, wherein the first calculating unit calculates the temperature change amount for each charge amount based on a first SOC, a second SOC, a first temperature, and a second temperature,
the first SOC is the SOC of the battery measured at a first time point, and the second SOC is the SOC of the battery measured at a second time point different from the first time point, and
the first temperature is the temperature of the battery measured at the first time point, and the second temperature is the temperature of the battery measured at the second time point.

4. The apparatus for a BMS of claim 2, wherein the control unit charges the battery with a second charging current that is the first charging current or less as the charging current of the battery, when the temperature of the battery measured by the measuring unit exceeds the first reference temperature.

5. The apparatus for a BMS of claim 2, wherein the control unit charges the battery with a third charging current different from the first charging current as the charging current of the battery, when the SOC of the battery measured by the measuring unit exceeds the first reference value.

6. A control method for an apparatus for a battery management system (BMS) comprising:
a measuring step of measuring or estimating a temperature, a state of charge (SOC), a voltage, and a charging current of a battery;
a first calculating step of calculating a temperature change amount for each charge amount of the temperature of the battery with respect to the SOC or the voltage of the battery, based on the temperature, the SOC, and the voltage of the battery measured at different time points in the measuring step;
a second calculating step of calculating an expected temperature of the battery when the SOC of the battery is charged with a first reference value, based on the temperature, the SOC, and the temperature change amount for each charge amount of the battery; and
a controlling step of controlling a first charging current based on information obtained by comparing the expected temperature calculated in the second calculating step and a predetermined first reference temperature, and charging the battery with the first charging current.

7. The control method for an apparatus for a BMS of claim 6, wherein in the controlling step, the first charging current is increased when the expected temperature is the first reference temperature or less, and the first charging current is decreased when the expected temperature is the first reference temperature or more.

8. The control method for an apparatus for a BMS of claim 7, wherein in the first calculating step, the temperature change amount for each charge amount is calculated based on a first SOC, a second SOC, a first temperature, and a second temperature,
the first SOC is the SOC of the battery measured at a first time point, and the second SOC is the SOC of the battery measured at a second time point different from the first time point, and
the first temperature is the temperature of the battery measured at the first time point, and the second temperature is the temperature of the battery measured at the second time point.

9. The control method for an apparatus for a BMS of claim 7, wherein in the controlling step, the battery is charged with a second charging current that is the first charging current or less as the charging current of the battery, when the temperature of the battery measured in the measuring step exceeds the first reference temperature.

10. The control method for an apparatus for a BMS of claim 7, wherein in the controlling step, the battery is charged with a third charging current different from the first charging current as the charging current of the battery, when the SOC of the battery measured in the measuring step exceeds the first reference value.

* * * * *